US012765099B2

(12) United States Patent
Zheng et al.

(10) Patent No.: US 12,765,099 B2
(45) Date of Patent: Oct. 13, 2026

(54) PHOTODIODE WITH DEEP TRENCH ISOLATION STRUCTURES

(71) Applicant: GlobalFoundries Singapore Pte. Ltd., Singapore (SG)

(72) Inventors: Ping Zheng, Singapore (SG); Eng Huat Toh, Singapore (SG); Cancan Wu, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 510 days.

(21) Appl. No.: 18/064,890

(22) Filed: Dec. 12, 2022

(65) Prior Publication Data

US 2024/0194714 A1 Jun. 13, 2024

(51) Int. Cl.
*H10F 39/00* (2025.01)

(52) U.S. Cl.
CPC ......... *H10F 39/807* (2025.01); *H10F 39/011* (2025.01); *H10F 39/805* (2025.01); *H10F 39/8063* (2025.01)

(58) Field of Classification Search
None
See application file for complete search history.

(56) References Cited

U.S. PATENT DOCUMENTS

| | | | | |
|---|---|---|---|---|
| 9,160,949 B2 | 10/2015 | Zhang et al. | | |
| 2012/0261783 A1* | 10/2012 | Prima | H10F 39/18 257/447 | |
| 2016/0112614 A1* | 4/2016 | Masuda | G02B 1/118 348/374 | |
| 2019/0157323 A1* | 5/2019 | Ogi | H04N 25/70 | |
| 2021/0066225 A1 | 3/2021 | Chou et al. | | |
| 2021/0273123 A1* | 9/2021 | Yang | H10F 30/2215 | |
| 2022/0005849 A1 | 1/2022 | Zang et al. | | |
| 2022/0190019 A1* | 6/2022 | Liu | H10F 39/024 | |
| 2022/0406835 A1* | 12/2022 | Uehira | H10F 39/807 | |
| 2023/0065063 A1 | 3/2023 | Zheng et al. | | |
| 2024/0145499 A1* | 5/2024 | Liu | H10F 39/8033 | |

FOREIGN PATENT DOCUMENTS

| | | |
|---|---|---|
| EP | 3896746 A1 | 10/2021 |
| EP | 3516692 B1 | 2/2022 |

OTHER PUBLICATIONS

European Search Report from related EP application No. 23201773.1 dated Mar. 25, 2024.

K. Morimoto et al., "High fill-factor miniaturized SPAD arrays with a guard-ring-sharing technique", Optics Express, vol. 28, No. 9/27, Apr. 2020.

K. Ito et al., "A Back Illuminated 10μm SPAD Pixel Array Comprising Full Trench Isolation and Cu—Cu Bonding with Over 14% PDE at 940nm", IEEE International Electron Devices Meeting (IEDM), 2020.

* cited by examiner

*Primary Examiner* — Yara B Green
*Assistant Examiner* — Coralie A Nettles

(57) ABSTRACT

A photodiode device includes a semiconductor substrate, a plurality of pixels, each of the pixels including a diode structure on a first side of the substrate and a conductive layer on a second side of the substrate, and DTI structures isolating adjacent pixels from one another, the DTI structures including a conductive material that electrically couples the conductive layer on the second side of the substrate and a metal line on the first side of the substrate. The conductive material in the DTI structures is part of an electrode circuit for the pixels.

18 Claims, 7 Drawing Sheets

PHOTODIODE WITH DEEP TRENCH ISOLATION STRUCTURES

BACKGROUND

Photodetectors are sensors that detect the presence of electromagnetic radiation. Semiconductor photodiodes are a category of photodetectors that use a P-N diode to convert incident photons into current. Photodiodes are used by many different technologies to sense one or more frequency of light, to determine the time at which transmitted light is reflected back to the photodiode, etc.

Avalanche photodiodes are a highly biased photodiodes in which photo-generated carriers are multiplied by avalanche breakdown in the device. Single photon avalanche diodes (SPADs) are avalanche photodiodes which are sensitive enough to detect the incidence of a single photon, and have lower noise and jitter than typical photodiodes. As technology progresses, there is an increasing demand for further miniaturization and improvements to photodiode technology.

SUMMARY

Embodiments of the present disclosure are directed to a photodiode, a photodetector, and a method for forming a photodiode. The photodiode includes deep trench isolation (DTI) structures with a conductive material that is part of an electrode circuit of the photodiode.

In an embodiment, a photodiode device includes a semiconductor substrate, a plurality of pixels, each of the pixels including a diode structure on a first side of the substrate and a conductive layer on a second side of the substrate, and DTI structures isolating adjacent pixels from one another, the DTI structures including a conductive material electrically coupled to the conductive layer on the second side of the substrate and a metal line on the first side of the substrate.

An embodiment of a photodetector includes a photodiode device and a control circuit configured to control an operation of the photodiode device.

An embodiment of a method of forming a photodiode device includes providing a semiconductor substrate with first and second sides, the semiconductor substrate including a plurality of diode structures on the first side of the substrate respectively associated with a plurality of pixels, and a conductive layer on the second side of the substrate, and forming DTI structures isolating adjacent pixels from one another, the DTI structures including a conductive material that electrically couples the conductive layer on the second side of the substrate and a metal line on the first side of the substrate.

DETAILED DESCRIPTION

A detailed description of embodiments is provided below along with accompanying figures. The scope of this disclosure encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Although the terms “first” and/or “second” may be used herein to describe various elements, these elements should not be limited by these terms. These terms may be used merely to distinguish one element from another element. For instance, a first element discussed below could be termed a second element without departing from the teachings of the present disclosure. Similarly, the second element could also be termed the first element.

The drawings are not necessarily to scale and in some instances, proportions may have been exaggerated to clearly illustrate features of the embodiments. When a first element is referred to as being “on” a second element or “on” a substrate, it not only refers to a case where the first element is formed directly on the second element or the substrate but also a case where a third element exists between the first element and the second element or the substrate. An element “connected” or “coupled” to or with another element may be directly connected or coupled to or with the other element or, instead, one or more intervening elements may be present.

Figure 1A:
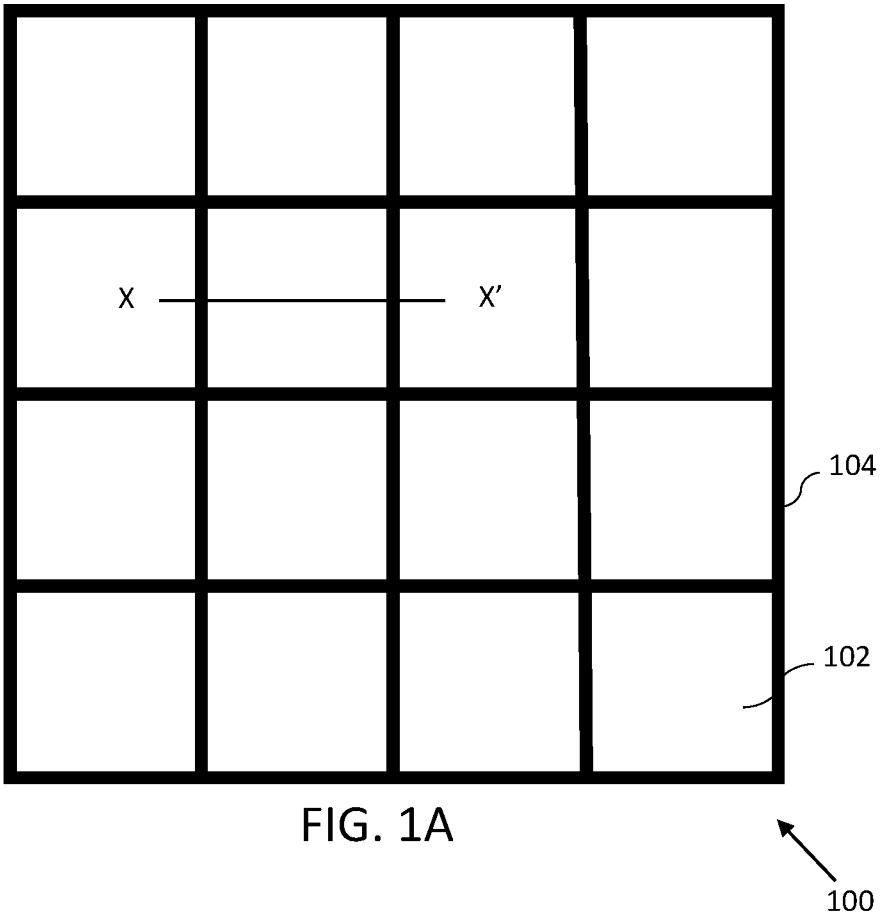
FIG. 1A illustrates a schematic diagram of a photodiode according to an embodiment.
Figure 1B:
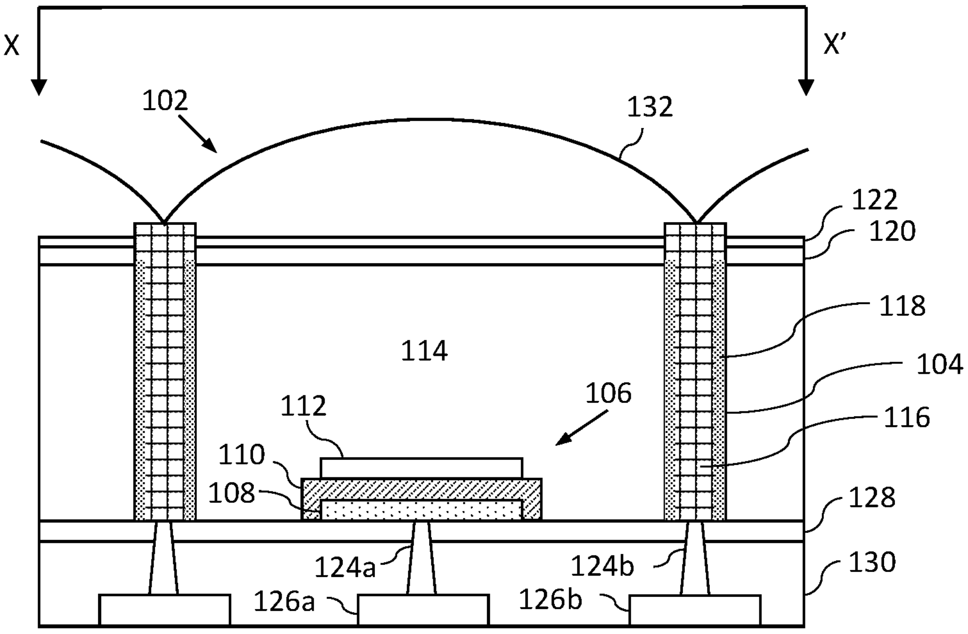
FIG. 1B illustrates a simplified cross-sectional view of the photodiode of FIG. 1A according to an embodiment.

FIG. 1A illustrates a photodiode device 100 according to an embodiment of the present disclosure. The device 100 illustrated by FIGS. 1A and 1B is a backside illuminated (BSI) single photon avalanche diode (SPAD) photodiode device, but in other embodiments, the photodiode device can be an avalanche photodiode (APD) device, for example.

An APD is a type of photosensitive semiconductor device in which light is converted to electricity due to the photoelectric effect coupled with electric current multiplication as a result of avalanche breakdown. APDs differ from conventional photodiodes in that incoming photons internally trigger a charge avalanche. APDs can measure low levels of light, and are widely used in long-distance optical communications and optical distance measurement where high sensitivity is needed.

SPADs are a type of APD that is sensitive enough to detect the incidence of a single photon. SPADs trigger an avalanche phenomenon with respect to the incidence of a single photon by applying a bias voltage higher than the breakdown voltage, and output a corresponding voltage pulse. The diode of an SPAD may employ a wide band-gap semiconductor material such as SiC, GaN, GaAs, AlN, AlAs, BN, GaP, AlP, ZnTe, MnTe, MgTe, ZnS, MgS, HgS, PbI2, TlPbI3, TlBr, TlBrI, or InAlP.

Returning to FIG. 1A, the photodiode device 100 has a plurality of pixels 102 that are separated by deep trench isolation (DTI) structures 104. The DTI structures 104 isolate the pixels 102 to prevent crosstalk between adjacent pixels. The photodiode device 100 may have any number of pixels 102 that define the resolution of the photodiode device 100. For example, when the photodiode device 100 is used in an image sensor, the device may have millions of pixels on a single chip, while a photodiode device 100 for a light detection and ranging (LiDAR) device may have only a few hundred or a few thousand pixels.

FIG. 1B illustrates cross-section X-X' of a pixel 102 of the photodiode device 100 illustrated in FIG. 1A. Each pixel 102 in the device includes a diode structure 106 on a first side of the substrate. The diode structures 106 include a first highly doped region 108 that may be doped with a first type of dopants, e.g. N dopants, a first well 110 that is doped with the first type of dopants and adjacent to the first doped region 108, and a second doped well 112 adjacent to the first doped well 110 and doped with a second type of dopants, e.g., P dopants.

The diode structure 106 is disposed in a doped epitaxial silicon substrate material 114 that is doped with the second type of dopants. When the first type of dopants are N dopants, the second type of dopants are P dopants. In such an embodiment, doped region 108 may be an N+ doped region, first doped well 110 may be an N well, second doped well 112 may be a P well, the semiconductor material 114 may be a P-doped epitaxial substrate, and conductive layer 120 may be a buried P layer.

The diode structure 106 is surrounded by DTI structures 104. The DTI structures 104 include a conductive material 116 disposed in a center portion of the structures, and portions of the sidewalls of the trenches are lined with an insulating liner layer 118. The conductive material may be a metal material such as tungsten, aluminum or copper, or a highly doped semiconductor material. The insulating liner layer 118 may be an oxide material such as silicon oxide or aluminum oxide. Spaces between the DTI structures 104 and diode structure 106 are filled with semiconductor material 114.

An anti-reflective coating layer 122 is disposed over a doped conductive layer 120 on a second side of the substrate which is a light-facing side of the device, and a micro-lens 132 is disposed over the anti-reflective coating layer 122. The doped conductive layer 120 may be a buried doped layer that is doped with the first type of dopants that are the same type of dopants as first doped region 108. The micro-lens 132 may focus photons toward the diode structure 106, and may be formed of a polymer or fused silica material.

The conductive layer 120 has a higher doping than semiconductor material 114 and is disposed on an opposite side of the semiconductor material 114 from the diode structure 106. In an embodiment of the present disclosure, the insulating liner layer 118 terminates below the top of the trenches to expose conductive layer 120. In an embodiment, as seen in FIG. 1B, the conductive material 114 extends over upper edges of the insulation liner layer 118. Accordingly, a first end portion of the conductive material 116 of the DTI structures 104 fills the space above the insulating liner layer 118 so that the conductive material 116 is electrically coupled to the conductive layer 120. In an embodiment in which the first type of dopants are N dopants and the second type are P dopants, the conductive layer 120 is an anode pickup of the photodiode device 100.

In another embodiment, the first dopants are P dopants and the second dopants are N dopants. In such an embodiment, the doped region 108 may be a P+ doped region, doped well 110 may be a P-well, doped well 112 may be an N-well, and the substrate material 114 may be an N-doped epitaxial silicon substrate. In such an embodiment, conductive layer 120 may be a buried N-doped layer, and the conductive layer 120 is a cathode pickup or cathode electrode of the device 100. Accordingly, the conductive layer 120 may be an anode electrode or a cathode electrode of the device 100 in different embodiments.

The second end or lower side of the conductive material 116 of the DTI structures 104 is coupled to a contact 124*b*, which in turn is coupled to a metal line 126*b*. Similarly, first doped region 108 is coupled to a contact 124*a*, which in turn is coupled to a metal line 126*a*.

The contacts 124 and metal lines 126 are part of a circuit structure of the photodiode device 100. The circuit structure may include circuitry for biasing the diode structure 106 and detecting voltage pulses caused by the incidence of photons. Collectively, the metal lines 126*b*, contacts 124*b*, DTI structures 104 and conductive layer 120 may provide an anode structure or a portion of an anode circuit of the photodiode 100.

The contacts 124 extend through, or penetrate, an etch stop layer 128 and a portion of an interlayer dielectric layer 130. The contacts 124 may be a metal material or a doped semiconductor, and the metal lines 126*b* may be tungsten, for example. The etch stop layer 128 may be a nitride or oxide material, and the interlayer dielectric layer 130 may be an oxide material such as silicon oxide.

A first embodiment of a process of forming a photodiode device 100 will now be explained with respect to FIGS. 2A-2F. A process of forming a photodiode device 100 may include providing a semiconductor substrate including a plurality of diode structures 106, contacts 124, and metal lines 126 disposed on a frontside of a semiconductor substrate along with corresponding circuit structures.

The substrate has a doped semiconductor region 114, and a buried doped layer (e.g, a buried N layer or a buried P layer) on the backside of the substrate that has a higher doping than the semiconductor material 114. The buried doped layer may be formed by implanting dopants into a semiconductor material when the substrate is formed.

The semiconductor substrate is flipped to expose the backside of the substrate including the buried doped layer, and a portion of backside surface is removed by a thinning operation to form conductive layer 120. The thinning operation may be a backgrinding operation that is accomplished by performing a chemical mechanical polishing (CMP) process until the remaining material has an appropriate thickness for an electrode of a photodiode. In such an embodiment, the thinned buried doped layer is the conductive layer 120.

Figure 2A:
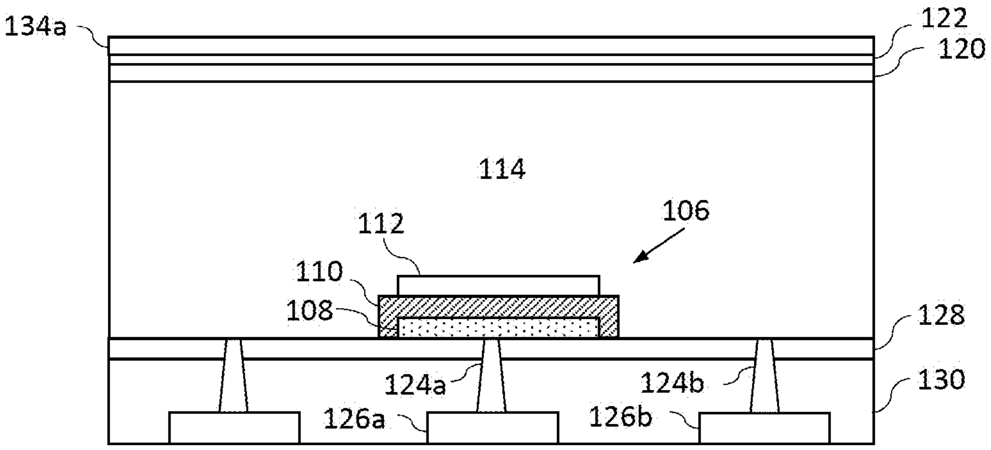
FIGS. 2A-2F illustrate simplified cross-sectional views of a process of forming the photodiode of FIG. 1B according to an embodiment.
Figure 2B:
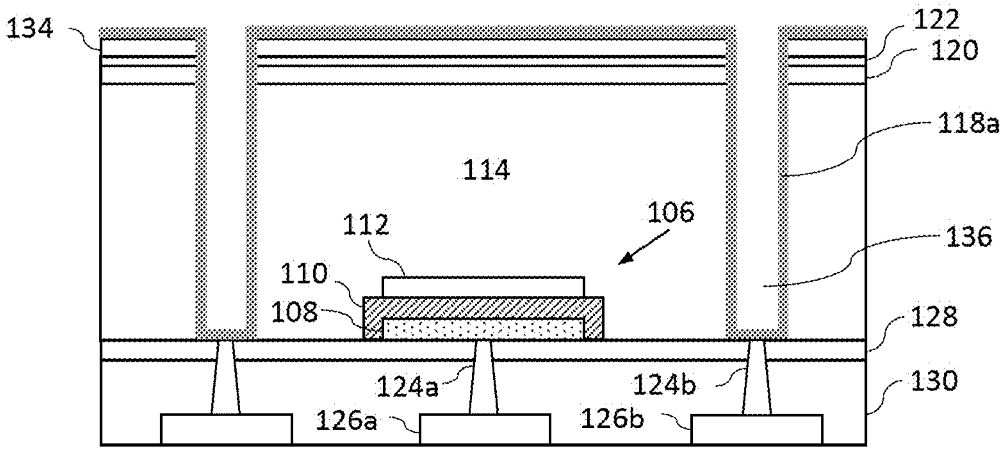

As illustrated in FIG. 2A, an anti-reflective coating 122 is formed on the conductive layer 120, and an initial hard mask layer 134*a* is formed on the anti-reflective coating 122. The anti-reflective coating 122 and hard mask layer 134*a* may be formed using materials and processes as known in the art. The anti-reflective coating 122 may be selected based on the desired characteristics of the photodiode, and may include one or more layer of material. The hard mask layer 134*a* may be a nitride material such as titanium nitride.

Next, trenches 136 are formed around diode structure 106. The trenches 136 may be formed by patterning a photoresist layer and performing an etch process in which the etch stop layer 128 and contacts 124 are used as etch stop materials. An insulation liner material **118*a* is deposited over the entire structure shown in FIG. 2B, including sidewalls and bases of the trenches 136 and hard mask layer 134**.

Figure 2C:
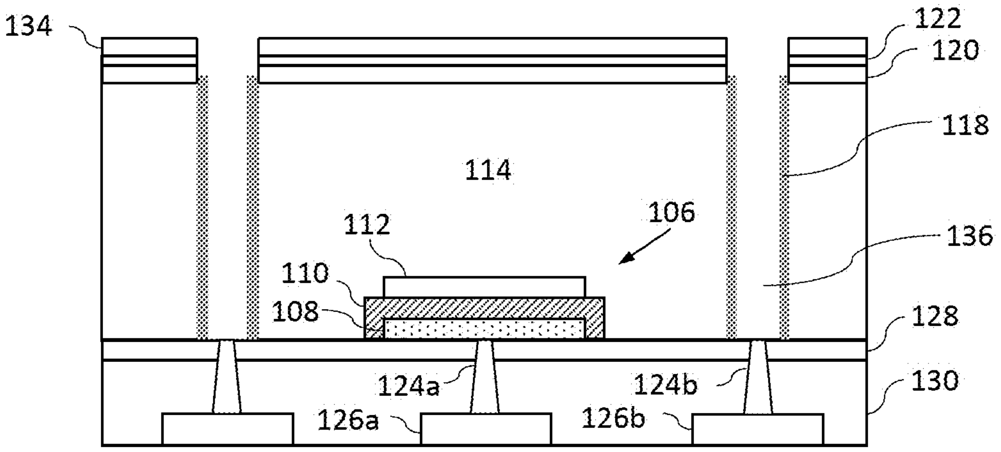

An etch process is performed to remove portions of the insulation liner material **118*a*. As seen in FIG. 2C, the etching process removes portions of insulation liner material 118*a* on hard mask layer 134, and removes insulation liner material 118*a* from the bottom of trenches 136 to expose contacts 124*b*. The etch process also removes portions of the insulation liner material 118*a* from the conductive layer 120 so that edges of the conductive layer 120 are exposed by a sidewall of trenches 136 while leaving portions of the insulation liner material 118*a* over sidewalls of the trenches 136 intact, thereby forming insulation liner layers 118 over sidewalls of the trenches. In a resulting structure, the insulation liner layers 118 are only disposed on sidewalls of trenches 136**. The etching process may be an anisotropic dry etching process.

Figure 2D:
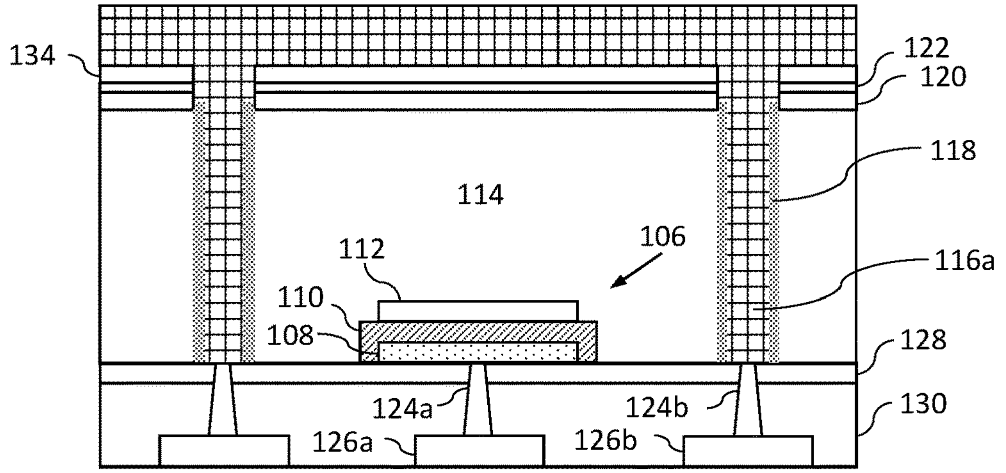

Material **116*a* is deposited to fill trenches 136 as shown in FIG. 2D. Examples of the material 116*a* are metal materials such as tungsten and copper, and semiconductor materials. When material 116*a*** is a semiconductor material, the material may be doped by an in-situ doping process or a separate doping operation.

In the deposition process shown in FIG. 2D, material **116*a* is deposited over the exposed surface, including over hard mask layer 134 that extends between the trenches 136. The material on the top surface is removed, for example by a CMP process or an etch-back process. Material 116*a* is removed from the surface to expose hard mask layer 134**, which may serve as a stop layer for the removal process.

After removing material **116*a* from the upper surface, the hard mask layer 134 is removed. The hard mask layer 134 may be removed by performing an etch process using an etchant that removes the hard mask material while selectively leaving material 116*b* extending from the trenches substantially intact. Accordingly, the process to remove material 134 may use a material with etch chemistry that removes the hard mask material 134 and has high selectivity to material 116*b***.

Figure 2E:
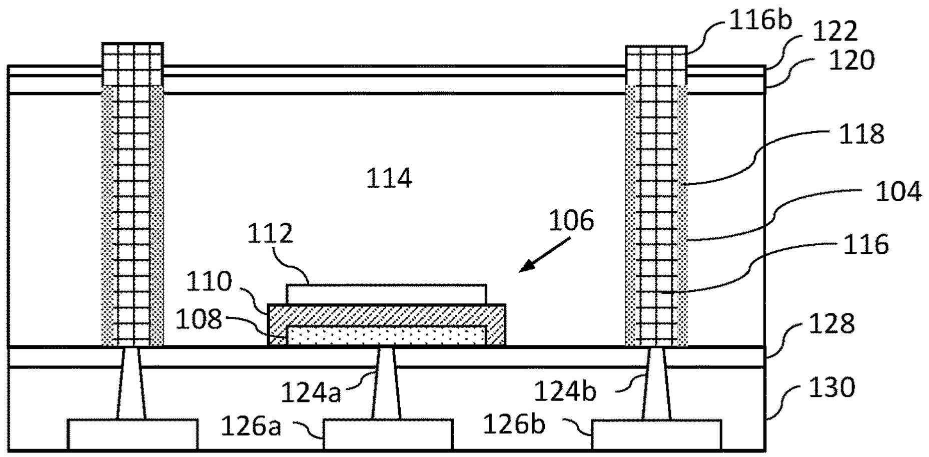
Figure 2F:
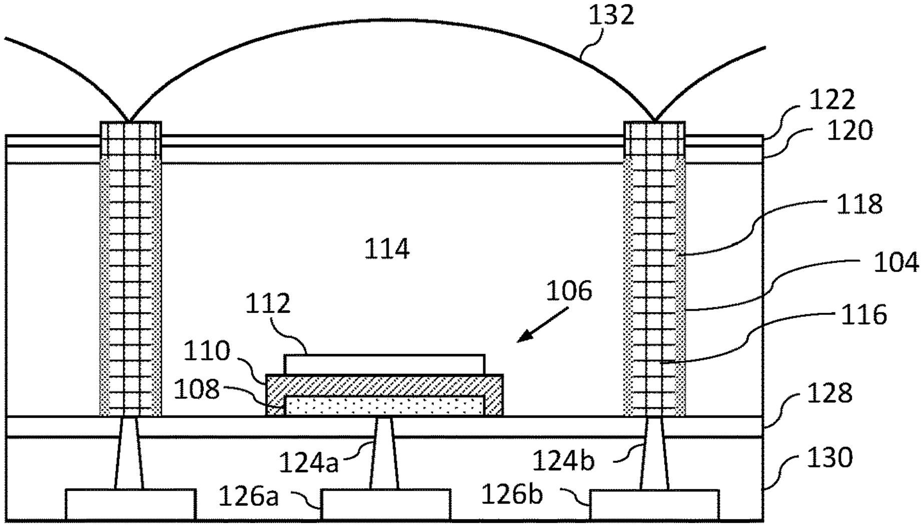

The resulting structure from removing hard mask layer 134 is shown in FIG. 2E. Micro-lenses 132 are formed over respective pixels 102 as shown in FIG. 2F. In the resulting structure, an upper portion **116*b* of conductive material 116 extends above an upper surface of the device, e.g., above an upper surface of the anti-reflective coating layer. The upper portion 116*b* of conductive material 116 has a width that is substantially the same as the width of the upper portion of trench 136, e.g., the portion of the trench that coincides with exposed parts of conductive layer 120**.

As seen with respect to FIG. 2E and FIG. 1A, the DTI structures 104 extend around pixels 102, isolating adjacent pixels from one another. At the same time, an upper side surface of the conductive layer 116 is electrically coupled to conductive layer 120, which may be a buried Player. Accordingly, the conductive material 116 filling the DTI structures 104 electrically couple conductive layer 120 to power control circuitry on the device to operate conductive layer 120 as an anode pickup for the photodiode device 100.

Figure 3A:
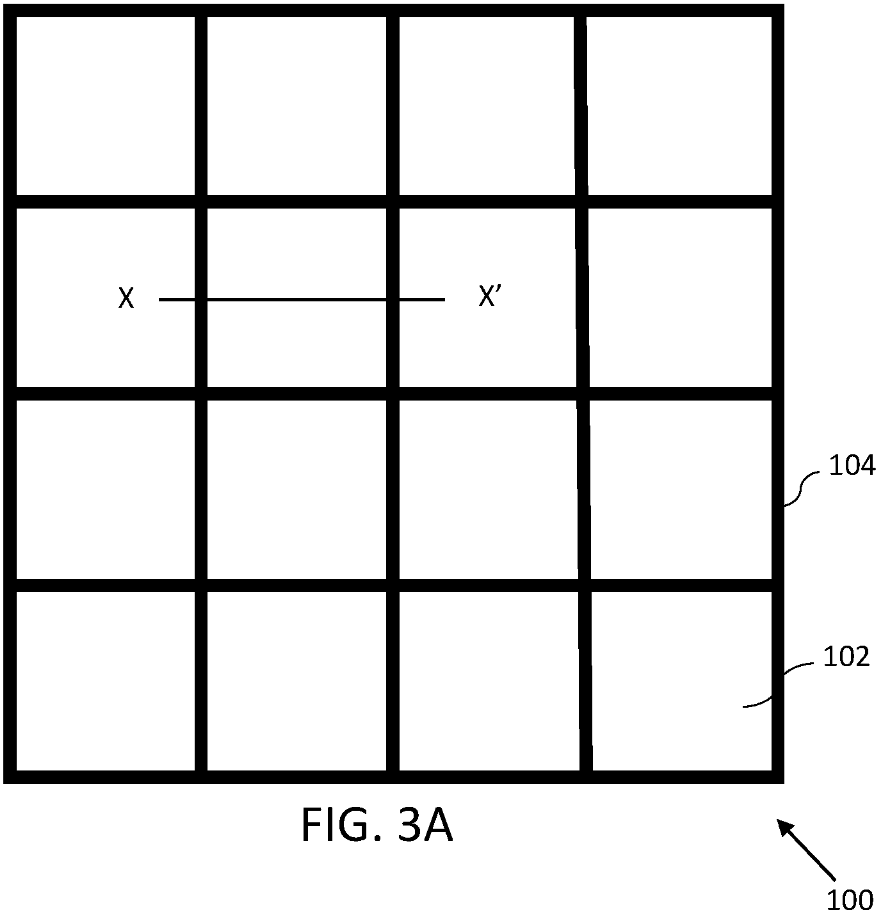
FIG. 3A illustrates a schematic diagram of a photodiode according to an embodiment.
Figure 3B:
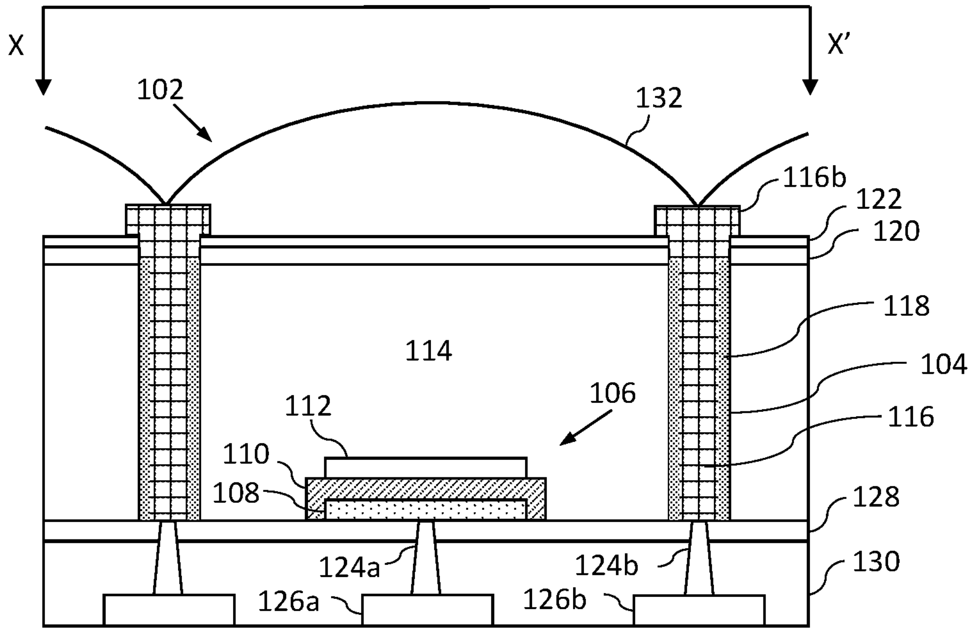
FIG. 3B illustrates a simplified cross-sectional view of the photodiode of FIG. 3A according to an embodiment.

FIGS. 3A and 3B illustrate a photodiode device 100 according to another embodiment. The photodiode device 100 in these figures is similar to the embodiment shown in FIGS. 1A and 1B. For example, the device 100 in FIGS. 3A and 3B has a plurality of pixels 102 that are separated by deep trench isolation (DTI) structures 104 which isolate the pixels 102.

Each pixel 102 includes a diode structure 106, and the diode structure 106 has a first doped region 108 doped with a first dopant type, a first doped well 110 adjacent to the first doped region 108 and doped with the first type of dopants, and a second doped well 112 adjacent to the first doped well 110 and doped with a second dopant type. The diode structure 106 is disposed in a doped semiconductor material 114 doped with the second type of dopants.

The DTI structures 104 include a conductive material 116 disposed in a center part of the structures, and sidewalls of the trenches are lined with an insulating liner layer 118. An anti-reflective coating layer 122 is disposed over a conductive layer 120 on a light-facing side of the device, and a lensing structure such as a micro-lens 132 is disposed over the anti-reflective coating layer 122 to focus photons that encounter the photodiode 100 towards the diode structure 106.

Both the devices in FIGS. 1A and 1B and 3A and 3B have a conductive layer 120 that has a higher doping than semiconductor material 114 and the same type of dopants is disposed on an opposite side of the semiconductor material 114 from the diode structure 106. The insulating liner layer 118 terminates before the end of the trenches so that the conductive material 116 in the DTI structures 104 is electrically coupled to the conductive layer 120. The conductive layer 120 may be a buried doped layer with respect to the original substrate, and serve as an anode or cathode electrode of the photodiode device 100.

The opposite side of the conductive material 116 of the DTI structures 104 is coupled to a contact **124*b*, which in turn is coupled to a metal line 126*b*. Similarly, first doped region 108 is coupled to a contact 124*a*, which in turn is coupled to a metal line 126*a*. The contacts 124 and metal lines 126 are part of a circuit structure of the photodiode device 100, and the circuit structure may include circuitry for biasing the diode structure 106 and detecting voltage pulses caused by the incidence of photons. Collectively, the metal lines 126*b*, contacts 124*b*, DTI structures 104 and conductive layer 120 provide an anode or cathode structure of the photodiode 100** of both devices.

One difference between the embodiment of FIGS. 3A and 3B to the embodiment of FIGS. 1A and 1B is the size of the upper portion **116*b* of conductive material 116. In the embodiment of FIGS. 3A and 3B, the upper portion 116*b* is wider than openings within conductive layer 120 and anti-reflective layer 122, so that the conductive material 116 extends over a portion of the surface of anti-reflective layer 122 and overlaps with portions of underlying conductive layer 120 and semiconductor material 114**.

In addition, upper portion **116*b* of the conductive material 116 may extend above the surface of anti-reflective layer 122 by a different distance than embodiment of FIGS. 1A and 1B. These differences are the result of a different manufacturing process, which will be explained with respect to a second embodiment illustrated in FIGS. 4A to 4**F.

The second embodiment of process of forming a photodiode device 100 includes providing a semiconductor substrate including a plurality of diode structures 106, contacts 124, and metal lines 126 disposed on a frontside of the substrate along with corresponding circuit structures. The substrate has a doped semiconductor region 114, and a buried doped layer on the backside of the substrate that has a higher doping than the doped semiconductor region 114.

Figure 4A:
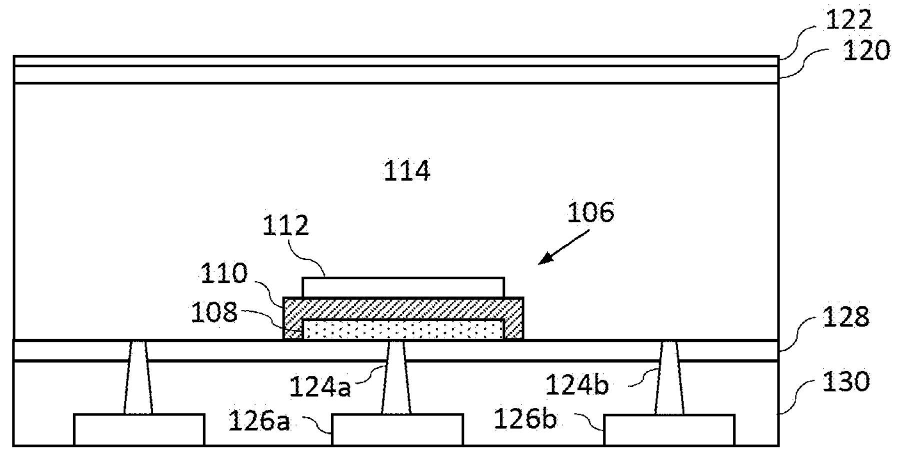
FIGS. 4A-4F illustrate simplified cross-sectional views of a process of forming the photodiode of FIG. 3B according to an embodiment.

The semiconductor substrate is flipped to expose the backside of the substrate including the buried layer, and a portion of the buried P-layer is removed by a thinning operation to form conductive layer 120. As illustrated in FIG. 4A, an anti-reflective coating 122 is formed on the conductive layer 120. Trenches 136 are formed around diode structure 106 by patterning a photoresist layer and performing an etch process in which the etch stop layer 128 and contacts 124 are etch stop structures.

Figure 4B:
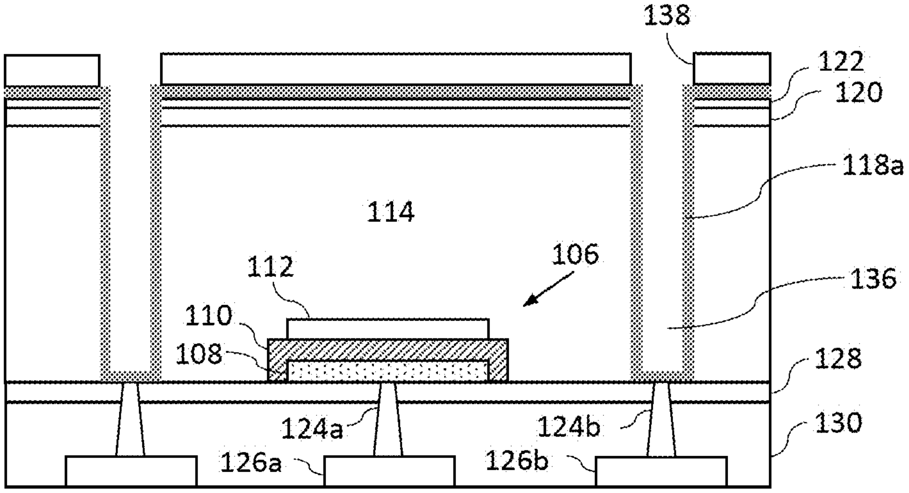

An insulation liner material 118*a* is deposited over the structure including sidewalls of trenches 136 and an upper surface of the device. As seen in FIG. 4B, a pattern 138 is formed over the insulation liner material 118*a*. The pattern 138 may be a photoresist material with openings aligned with trenches 136.

The openings in pattern 138 are larger than the trench openings so that the openings in the pattern expose portions of the insulation liner material 118*a* disposed on sidewalls of the trenches 136. In particular, the openings in pattern 138 expose an upper surface or corner of the insulation liner material 118*a*. The openings in pattern 138 may have a size that is at least the width of the trenches 136 minus the width of the insulation liner material 118*a* over sidewalls of the trenches.

Figure 4C:
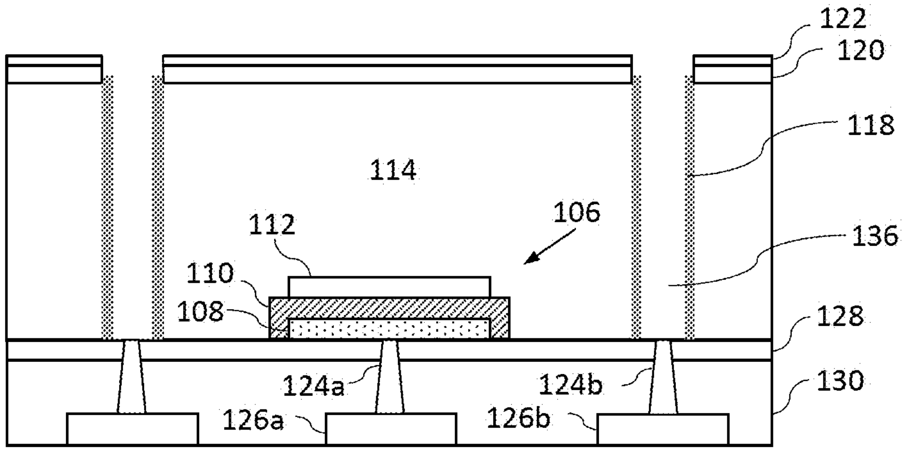

An etch process, which may be an anisotropic dry etch process, is performed using pattern 138 as a mask. As seen in FIG. 4C, the etch process removes portions of the insulation liner material 118*a* from the bottom of trenches 136 to expose contacts 124*b*, and removes portions of the insulation liner material 118*a* from the conductive layer 120 so that edges of the conductive layer 120 are exposed by a sidewall of trenches 136. The etch process leaves portions of the insulation liner material 118*a* over sidewalls of the trenches 136 intact, thereby forming insulation liner layers 118 disposed over sidewalls of the trenches.

Figure 4D:
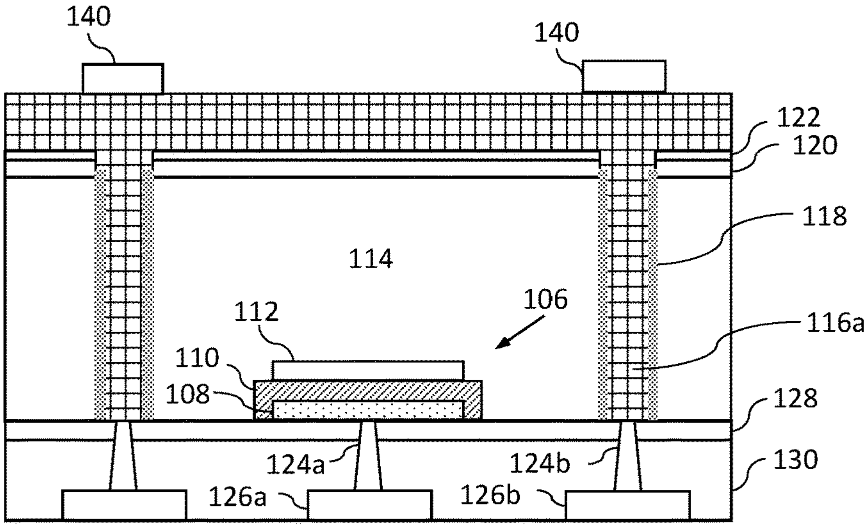

Material 116*a* is deposited to fill trenches 136 as shown in FIG. 4D, and over the upper surface of the device. Subsequently, a second pattern 140 is formed over material 116*a* using a photoresist material.

The second pattern 140 has lines that are aligned with trenches 136. In particular, the second pattern 140 may be a line type mask pattern that has a shape corresponding to the shape of DTI structures 104 in FIG. 3A. The lines of second pattern 140 may have a width that is greater than the width of trenches 136.

Figure 4E:
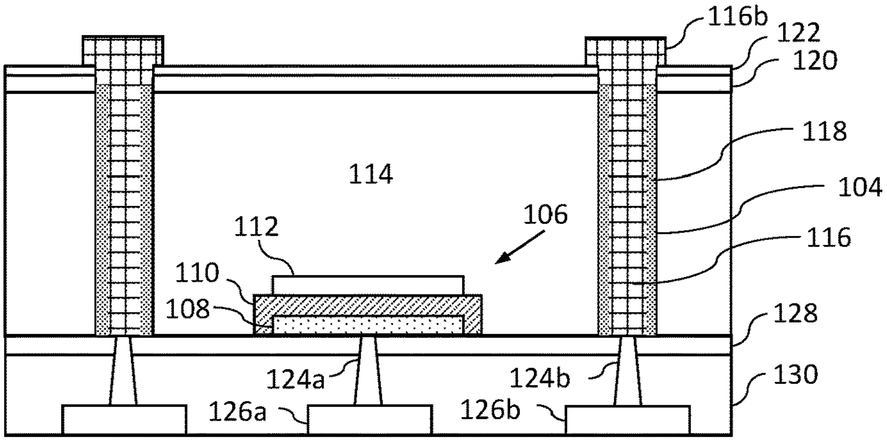

An etch process is performed to remove portions of material 116*a* using second pattern 140 as an etch mask. Subsequently, second pattern 140 is removed, resulting in the structure shown in FIG. 4E. In the structure of FIG. 4E, the upper portion 116*b* of conductive material 116 has shoulders that are wider than the opening of trench 136 so that the shoulders extend over an upper surface of the device. In addition, the shoulders of upper portion 116*b* extend over portions of anti-reflective coating 122.

Figure 4F:
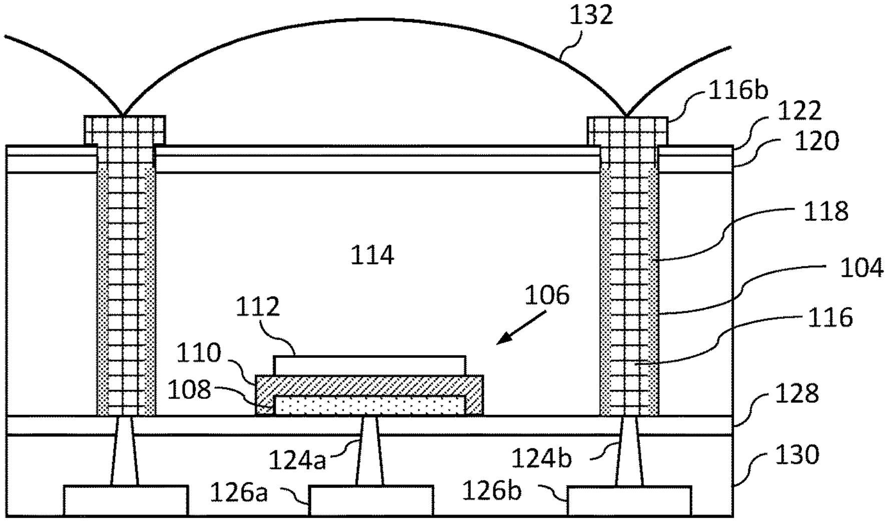

As shown in FIG. 4F, micro-lenses 132 are formed over each pixel 102 of the photodiode device.

In the second embodiment of FIGS. 3 and 4, upper portion 116*a* has a different size than the same feature in the first embodiment of FIGS. 1 and 2 since the size of upper portion 116*a* is controlled by second pattern 140. Accordingly, the second embodiment can present a larger target for forming micro-lenses 132, and may have lower resistance while having a minimal impact on photon detection. On the other hand, quantum efficiency may be lower in the second embodiment.

Otherwise, the device in FIG. 4F is similar to the device in FIG. 2F. In both devices, DTI structures 104 perform dual roles of both isolating adjacent pixels 102 and providing a conductive path between conductive layer 120 and device circuitry through contacts 124 and metal lines 126 so that the DTI structures 104 are part of an anode or cathode circuit of the photodiode device 100.

Figure 5:
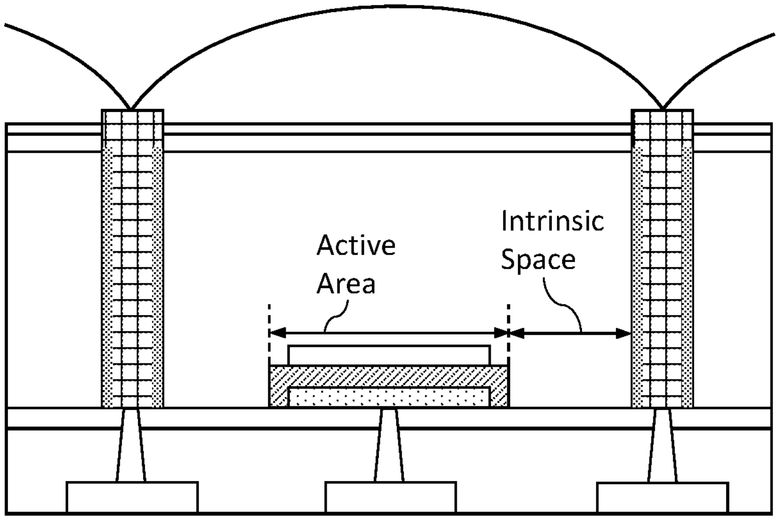
FIG. 5 illustrates active area and intrinsic space in a pixel of a photodiode device according to an embodiment.

Embodiments of the present disclosure have multiple advantages compared to conventional structures. FIG. 5 shows a device with an active area and an intrinsic space—the active area corresponds to the width of a diode structure 106, and the intrinsic space is the space between the active area and a DTI structure 104.

Because the embodiment in FIG. 5 does not have additional conductive structures located in the intrinsic space region of the pixels, it is possible to enlarge the active area while keeping the same intrinsic space of a conventional device. Increasing the active area increases the fill factor of a device, which improves the ability of a pixel to detect photons incident to the pixel area.

On the other hand, it is possible to shrink the size of the intrinsic space while maintaining the same active area. Reducing the intrinsic space decreases the size (pitch) of a pixel, leading to increased pixel density on a device. It is possible to adjust both the intrinsic space and active area individually or simultaneously to achieve one or both of a higher fill factor and a higher pixel pitch compared to a conventional device.

There is a tradeoff between pixel pitch and fill factor depending on the size of the active area and the intrinsic space. In embodiments of the present disclosure, photon detection probability is maintained or increased and dark current is not substantially degraded compared to conventional devices.

Figure 6:
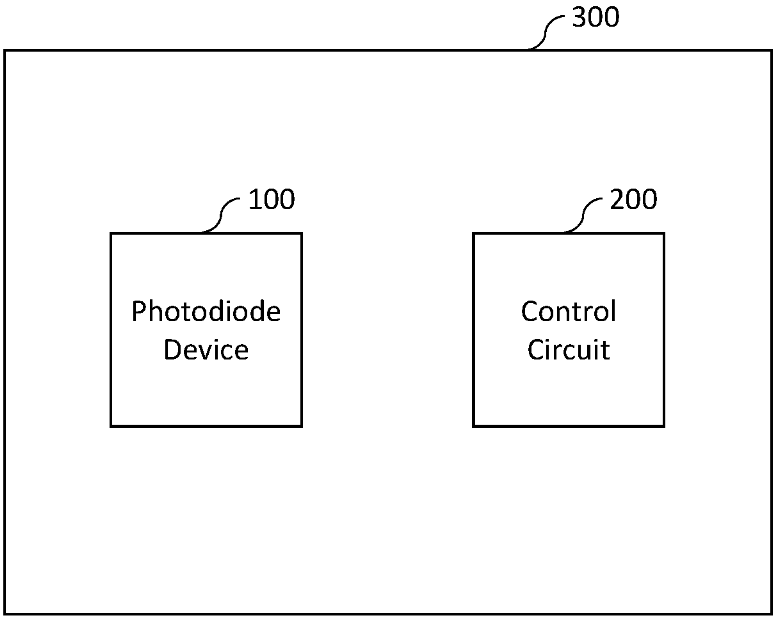
FIG. 6 illustrates a photodetector according to an embodiment.

FIG. 6 illustrates an embodiment of a photodetector 300. The photodetector 300 includes a photodiode device 100 according to an embodiment of the present disclosure, and a control circuit 200. The control circuit 200 may include circuitry to control operations of photodiode device 100 and to process signals received from the photodiode device 100. In an embodiment, the photodiode device 100 is coupled to control circuit 200 through metal lines 126, which may be part of the control circuit.

In some embodiments, the photodiode device 100 is on a separate die from the control circuit 200, and the dies may be stacked in a three-dimensional structure and/or coupled to control circuit 200 by an interposer substrate. Accordingly, the photodetector 300 in FIG. 6 may be embodied in various forms.

The resulting photodiode 100 is suitable for use in a variety of electronic devices, including imaging devices and focusing aides, optical devices including fiber-optic communication devices, cell phones, computer devices, security equipment, detection equipment including LiDAR, IoT and general household equipment, etc. The photodiode may be an avalanche photodiode or a single photon avalanche photodiode, for example.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A photodiode device, comprising:

a semiconductor substrate;

a plurality of pixels, each of the pixels including a diode structure on a first side of the semiconductor substrate and a conductive layer on a second side of the semiconductor substrate;

deep trench isolation (DTI) structures isolating adjacent pixels from one another, the DTI structures including a conductive material electrically coupled to the conductive layer on the second side of the substrate and a metal line on the first side of the semiconductor substrate;

an insulation liner layer disposed over sidewalls of trenches within the DTI structures, wherein the conductive material includes a first shoulder that overlaps upper edges of the insulation liner layer; and an anti-reflective layer over the conductive layer, wherein the conductive material extends through an entire thickness of the conductive layer, and a sidewall of the first shoulder contacts the conductive layer, and wherein the conductive material further comprises a second shoulder above the first shoulder, and the second shoulder overlaps a portion of the anti-reflective coating layer.

2. The photodiode device of claim 1, wherein the conductive layer is an electrode of the respective pixel.

3. The photodiode device of claim 1, further comprising contacts coupled to the conductive material within the DTI structures and disposed on the first side of the semiconductor substrate at a base of the trenches.

4. The photodiode device of claim 3, wherein the contacts extend through an etch stop layer and an interlayer dielectric layer.

5. The photodiode device of claim 1, wherein the photodiode device is a single-photon avalanche diode.

6. The photodiode device of claim 1, wherein the diode structure includes a first doped region, a first doped well over the first doped region, and a second doped well over the first doped well, the first doped region and first doped well are doped with a first type of dopants, and the second doped well and the conductive layer are doped with a second type of dopants.

7. The photodiode device of claim 1, further comprising:

a plurality of micro-lenses over the anti-reflective coating, wherein the conductive material extends through the anti-reflective coating layer.

8. A photodetector, comprising:

a photodiode device; and a control circuit configured to control an operation of the photodiode device, wherein the photodiode device includes:

a semiconductor substrate;

a plurality of pixels, each of the pixels including a diode structure on a first side of the semiconductor substrate and a conductive layer on a second side of the semiconductor substrate;

deep trench isolation (DTI) structures isolating adjacent pixels from one another, the DTI structures including a conductive material electrically coupled to the conductive layer on the second side of the substrate and a metal line on the first side of the semiconductor substrate;

an anti-reflective layer over the conductive layer; and an insulation liner layer disposed over sidewalls of trenches within the DTI structures, wherein conductive material includes a first shoulder that overlaps upper edges of the insulation liner layer, wherein the conductive material extends through an entire thickness of the conductive layer, and a sidewall of the first shoulder contacts the conductive layer, and wherein the conductive material further comprises a second shoulder above the first shoulder, and the second shoulder overlaps a portion of the anti-reflective coating layer.

9. The photodetector of claim 8, wherein the conductive layer is an electrode of the respective pixel.

10. The photodetector of claim 8, further comprising contacts coupled to the conductive material within the DTI structures and disposed on the first side of the semiconductor substrate at a base of the trenches.

11. The photodetector of claim 10, wherein the contacts extend through an etch stop layer and an interlayer dielectric layer.

12. The photodetector of claim 8, wherein the photodiode device is a single-photon avalanche diode.

13. A method of forming a photodiode device, the method comprising:

providing a semiconductor substrate with first and second sides, the semiconductor substrate including a plurality of diode structures on the first side of the substrate respectively associated with a plurality of pixels, and a conductive layer on the second side of the substrate; and forming deep trench isolation (DTI) structures isolating adjacent pixels from one another, the DTI structures including a conductive material that electrically couples the conductive layer on the second side of the substrate and a metal line on the first side of the semiconductor substrate; and forming an anti-reflective layer over the conductive layer, wherein forming the DTI structures includes:

forming trenches in the semiconductor substrate; and depositing an insulation liner layer over sidewalls of the trenches, wherein an upper portion of the trenches is exposed by the insulation layer so that the conductive material is electrically coupled to the conductive layer in the upper portion of the trenches, and wherein a portion of the conductive material includes a first shoulder that overlaps upper edges of the insulation liner layer, wherein the conductive material further comprises a second shoulder above the first shoulder, and the second shoulder overlaps a portion of the anti-reflective coating layer, and wherein the conductive material extends through an entire thickness of the conductive layer, and a sidewall of the first shoulder contacts the conductive layer.

14. The method of claim 13, wherein the conductive material in the DTI structures is coupled to contacts disposed at the base of the trenches.

15. The method of claim 14, wherein the contacts at the base of the trenches are coupled to the metal lines, and the conductive layer on the second side of the substrate, the conductive material of the DTI structures, the contacts and the metal lines are part of a circuit for the pixel.

16. The method of claim 13, further comprising:

forming the diode structures on the first side of the semiconductor substrate, the semiconductor substrate having a buried doped layer on the second side.

17. The photodiode device of claim 1, wherein the conductive layer is a doped semiconductor material.

18. The photodiode device of claim 1, wherein the conductive material is a doped semiconductor material.

* * * * *